(12) United States Patent
Behrends et al.

(10) Patent No.: US 8,344,782 B2
(45) Date of Patent: Jan. 1, 2013

(54) METHOD AND APPARATUS TO LIMIT CIRCUIT DELAY DEPENDENCE ON VOLTAGE FOR SINGLE PHASE TRANSITION

(75) Inventors: Derick G. Behrends, Rochester, MN (US); Todd A. Christensen, Rochester, MN (US); Travis R. Hebig, Rochester, MN (US); Daniel M. Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 508 days.

(21) Appl. No.: 12/613,673

(22) Filed: Nov. 6, 2009

(65) Prior Publication Data

US 2011/0109366 A1 May 12, 2011

(51) Int. Cl.
*H03H 11/26* (2006.01)
(52) U.S. Cl. .......... 327/263; 327/278; 327/291
(58) Field of Classification Search .......... 327/263, 327/278, 291
See application file for complete search history.

(56) References Cited

U.S. PATENT DOCUMENTS

| 7,714,630 B2 * | 5/2010 | Behrends et al. ........... 327/278 |
| 2008/0122513 A1 * | 5/2008 | Ong et al. .................... 327/263 |

* cited by examiner

*Primary Examiner* — John Poos
(74) *Attorney, Agent, or Firm* — Bockhop & Associates LLC

(57) ABSTRACT

A delay circuit receives a data input having an input transition and that generates a data output having an output transition. The delay circuit is powered by a voltage source having a voltage. A first delay element is configured to generate a first data signal with a first edge that has a relatively constant delay relative to the input transition irrespective of the voltage of the voltage source. A second delay element is configured to generate a second data signal with a second edge that has a delay relative to the input transition as a function of the voltage of the voltage source. A selection element causes the output transition at the data output to correspond to a latest selected one of the first edge and the second edge. The delay circuit may be employed in a pulse generating circuit.

17 Claims, 3 Drawing Sheets

METHOD AND APPARATUS TO LIMIT CIRCUIT DELAY DEPENDENCE ON VOLTAGE FOR SINGLE PHASE TRANSITION

BACKGROUND OF THE INVENTION

1. Field of the Invention

The present invention relates to electronic circuits and, more specifically, to an electronic delay circuit that maintains a minimum amount of delay irrespective of a power supply voltage applied thereto.

2. Description of the Prior Art

Integrated circuits are powered by a power supply. A power supply provides a voltage to each of the transistors on an integrated circuit, without which the transistors would not be able to operate. The power supplies used in most high end integrated circuits are external to the integrated circuit and the integrated circuit includes a complicated network of conductors that connect the power supply to the individual transistors in the circuit.

Power supply voltage is often determined after integrated circuit processing is complete. Voltage is tuned to optimize power and performance. Increasing voltage reduces circuit delay, thereby increasing performance, but it also increases power usage by the circuit. There are many circuits, such as pulse generators and dynamic circuits, where some delay dependence on voltage is desired, but the circuits lose functionality if certain delays in critical paths are reduced too far. This can cause an otherwise good chip to be discarded because it does not meet power, performance, and functionality specifications.

An existing pulse generator circuit 100 is shown in FIG. 1. This circuit is sometimes referred to as a "clock chopper." Typically the circuit 100 includes a delay element 112 that employs a series of inverters or other typical delay circuits. The input signal 110, which typically includes a transition such as a low-to-high transition or a high-to-low transition, is delayed through the delay element 112 and the delayed and inverted signal is ANDed 116 with the original input signal to generate an output pulse.

A timing diagram relating the input signal 110, the inverted delay output 116 and the output pulse signal 120 is shown in FIG. 1B. As the power supply voltage (Vdd) applied to the delay element is increased, the amount of time until the corresponding transition is generated at the inverted delay output 116 tends to decrease. This tends to cause width of the pulse at the output 120 to narrow. At some point, as the power supply voltage increases the output pulse width becomes too narrow, at which point the output is not recognized as a pulse by subsequent circuitry, which can cause a malfunction.

As shown in FIG. 1C, shortly after a transition at the input 110 occurs (a low-to-high transition in the example shown), a copy of the transition is generated at the output. After a delay corresponding to the delay in the delay element, an opposite transition occurs at the output (a high-to-low transition in the example shown). If the power supply voltage (Vdd) is relatively low and the corresponding signal voltage is low 110', the opposite transition might occur as shown in curve 120' and the resulting pulse would be relatively broad; on the other hand, if the power supply voltage (Vdd) is relatively high and the corresponding signal voltage is high 110", the opposite transition might occur as shown in curve 120" and the resulting pulse would be relatively narrow.

Therefore, there is a need for a circuit that allows for some delay dependence on voltage, but that limits such dependence as voltage is increased past a predetermined threshold.

SUMMARY OF THE INVENTION

The disadvantages of the prior art are overcome by the present invention which, in one aspect, is a delay circuit that receives a data input having an input transition and that generates a data output having an output transition. The delay circuit is powered by a voltage source having a voltage. A first delay element is configured to generate a first data signal with a first edge that has a relatively constant delay relative to the input transition irrespective of the voltage of the voltage source. A second delay element is configured to generate a second data signal with a second edge that has a delay relative to the input transition as a function of the voltage of the voltage source. A selection element causes the output transition at the data output to correspond to a latest selected one of the first edge and the second edge.

In another aspect, the invention is a pulse generator that is configured to generate an output pulse at a data output, having an output trailing edge, corresponding to an input transition from a data input. A delay circuit generates an inverted copy of the input transition that is temporally offset from the input transition by a minimum amount of time. An AND gate ANDs the input transition and the inverted copy of the transition so as to generate the output pulse.

In yet another aspect, the invention is a method of generating a data output pulse at a data output based on an input transition at a data input. A first delay element that generates a first edge that is delayed from the input transition by a minimum delay period is powered with a predetermined reference voltage. A second delay element is powered with a variable source voltage. The second delay element generates a second edge that is delayed from the input transition as a function of the variable source voltage. A data output pulse is generated to the data output so that the data output pulse has an output trailing edge that is selected as the latest of the first edge and the second edge.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
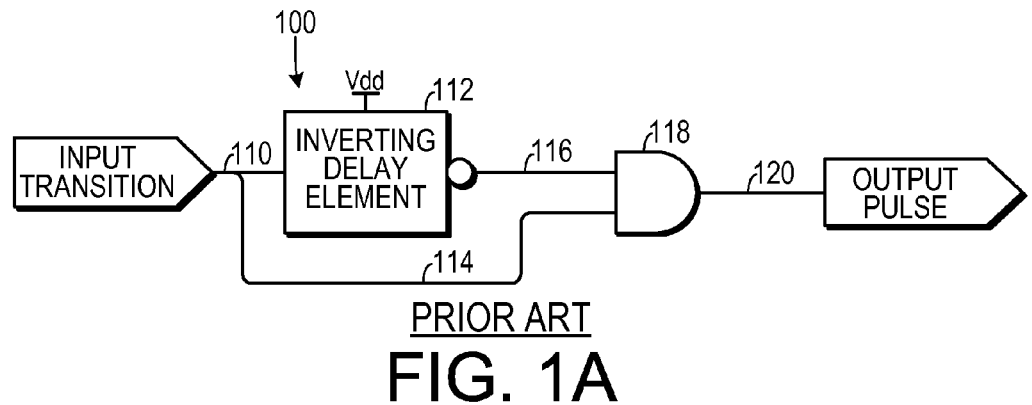
FIG. 1A is a schematic diagram of an existing pulse generating circuit.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the"includes plural reference, the meaning of "in" includes "in" and "on."

Figure 2A:
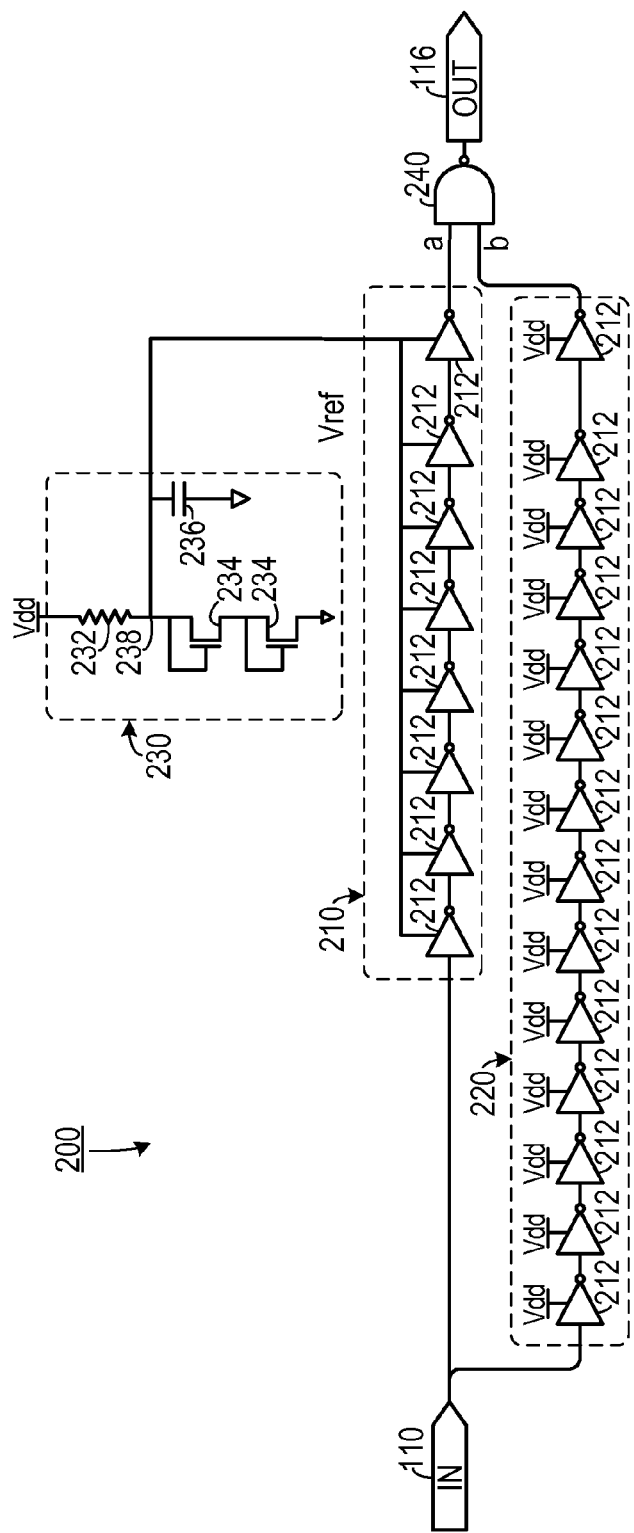
FIG. 2A is a schematic diagram of one embodiment of a minimum delay circuit.

As shown in FIG. 2A, one embodiment of an inverting delay circuit receives an input signal 110 that is propagated along a first delay path 210 and second delay path 220. The first delay path 210 includes a plurality of voltage sensitive delay elements 212 such as inverters coupled together in series. Each of the delay elements 212 in the first delay path 210 is powered by a reference voltage source 230 that is configured to maintain a relatively constant voltage. The second delay path 220 also includes a plurality of voltage sensitive delay elements 212. However, each of the delay elements 212 in the second delay path 220 is powered by a common voltage (such as a Vdd rail in a digital circuit). A NAND gate 240 performs a logical NAND on the outputs of the first delay path 210 (signal a) and the second delay path 220 (signal b). The result is a transition that corresponds to the later of the of the transition output from the first delay path 210 and the transition output from the second delay path 220. This transition is propagated to the output 116 of the delay circuit 200.

In one embodiment, the reference voltage source 230 includes two field effect transistors 234 that have their gates tied to their sources and that are coupled to each other in series. One of the field effect transistors 234 is coupled to a resister 232 that is coupled to a reference voltage node 238 and a power supply voltage (Vdd). A capacitor 236 is also electrically coupled to the reference voltage node 238 and also to a common voltage, such as a ground.

Figure 2B:
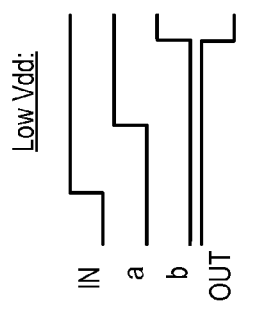
FIG. 2B is a timing diagram demonstrating the operation of the circuit shown in FIG. 2A when the power supply voltage is relatively high.
Figure 2C:
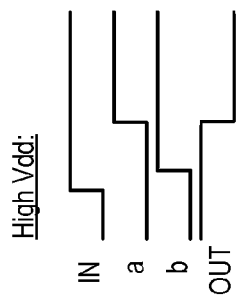
FIG. 2C is a timing diagram demonstrating the operation of the circuit shown in FIG. 2A when the power supply voltage is relatively low.

Two timing scenarios are demonstrated in FIGS. 2B and 2C. A high Vdd scenario is demonstrated in FIG. 2B, in which signal b from the second path 220 transitions shortly after the input transition as a result of the high Vdd. However, because the first path 210 is maintained at a relatively constant reference voltage, signal a transitions later that signal b, causing the output 116 to transition shortly after the transition of signal a. When the Vdd is relatively low, as shown in FIG. 2C, the transition of signal a occurs after about the same delay as the High Vdd scenario; however, the transition of signal b occurs much later and the output transitions shortly after the transition of signal b.

The delay element 200 can be placed inside of the delay block to achieve the desired voltage sensitivity to pulsewidth. The desired operation is to have the pulsewidth decrease as voltage is increased but as the voltage reaches a high value, then the pulsewidth remains relatively wide and does not further decrease with increasing voltage.

Figure 1B:
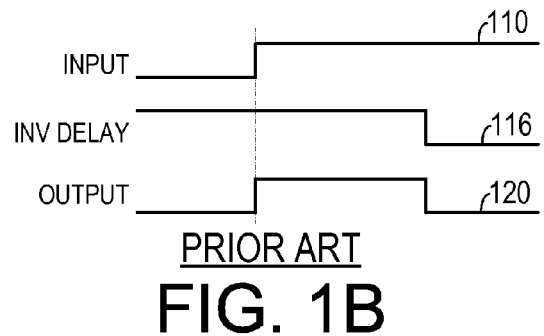
FIG. 1B is a timing diagram demonstrating the operation of the circuit shown in FIG. 1A.
Figure 1C:
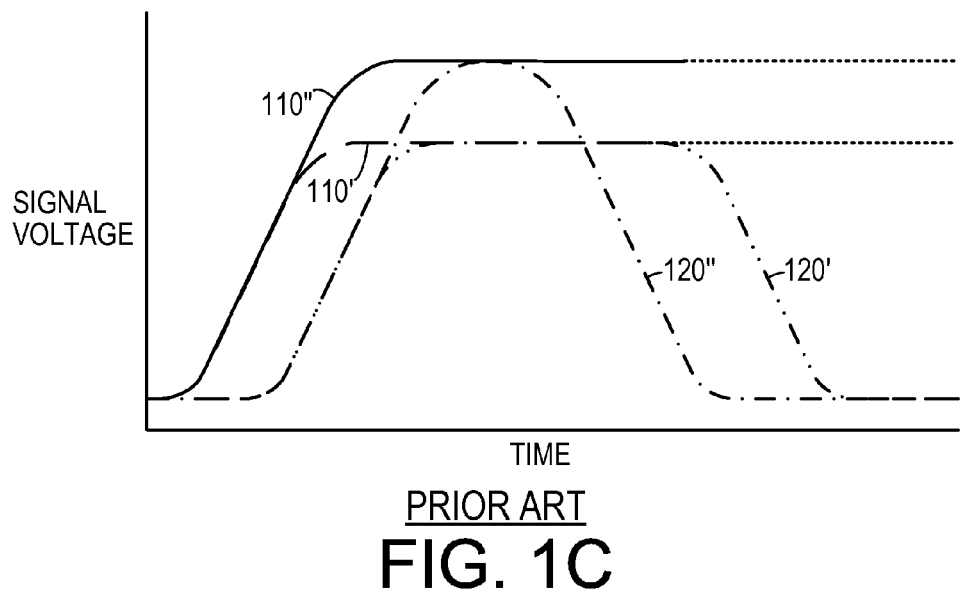
FIG. 1C is a signal diagram showing the result of two different power supply voltage scenarios corresponding to the circuit shown in FIG. 1A.
Figure 3:
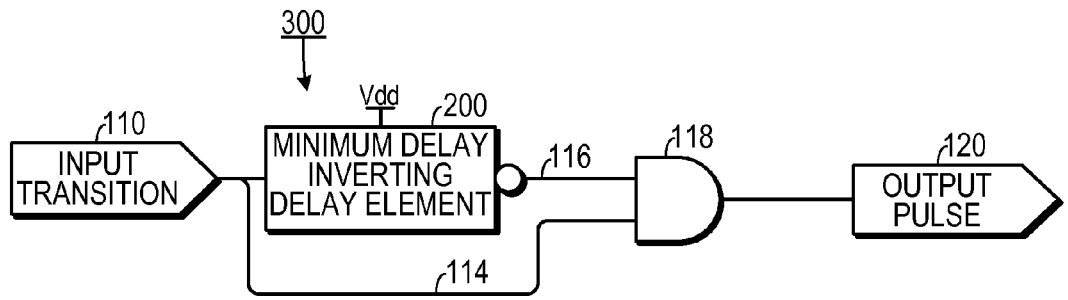
FIG. 3 is a schematic diagram of a pulse generating circuit employing a minimum delay circuit.
Figure 4A:
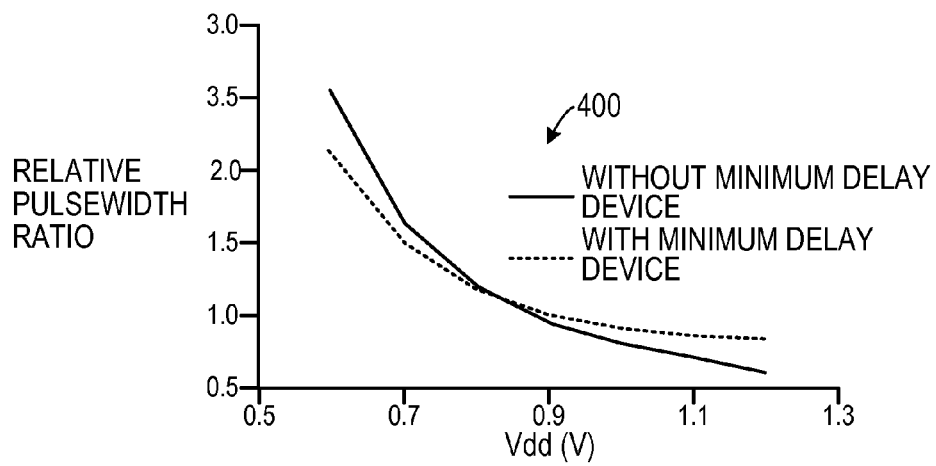
FIG. 4A is a graph comparing pulsewidth ratio to power supply voltage.
Figure 4B:
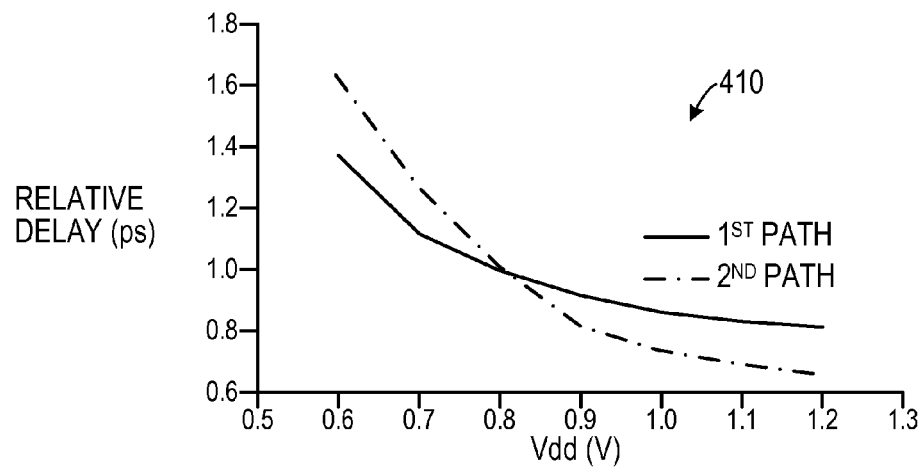
FIG. 4B is a graph comparing relative delay to power supply voltage.

A pulse generating circuit 300 employing the delay element 200 is shown in FIG. 3. This circuit 300 includes elements similar to those shown in FIG. 1, except that it uses a minimum delay inverting delay element of the type shown in FIG. 2A. The result is that pulses generated by this circuit 300 will retain a minimum width even if the value of the common voltage (Vdd) is relatively high. A graph 400 comparing the relative pulsewidth ratios of pulse generating circuits employing the minimum delay element and those not employing a minimum delay element is shown in FIG. 4A. A graph 410 showing the relative delay of both the first path 210 and the second path 220 as a function of power supply voltage (Vdd) is shown in FIG. 4B.

One embodiment of a delay circuit generates a delay that decreases with increasing voltage, but only up to a predetermined voltage threshold. Then, as voltage is further increased, the delay is constant. The circuit works in this manner for a single transition. In the example shown, the circuit works for a low-to-high input transitions. However the configuration can be easily changed to work for high-to-low transitions. This circuit is suitable to be used for critical timing paths in integrated circuits that have minimum delay requirements. Examples of these paths include pulse generators for sense amp set signals and wordline pulse widths in SRAM arrays and some dynamic logic circuits.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A delay circuit that receives a data input having an input transition and that generates a data output having an output transition, the delay circuit being powered by a voltage source having a voltage, comprising:
   a. a first delay element that is configured to generate a first data signal with a first edge that has a relatively constant delay relative to the input transition irrespective of the voltage of the voltage source;
   b. a second delay element that is configured to generate a second data signal with a second edge that has a delay relative to the input transition that is a function of the voltage of the voltage source; and
   c. a selection element that causes the output transition at the data output to correspond to a latest selected one of the first edge and the second edge.

2. The delay circuit of claim 1, wherein the first delay element and the second delay element each comprise an inverting delay element that is coupled to the data input and wherein selection element comprises a NAND gate that is coupled to the data output.

3. The delay circuit of claim 1, wherein the first delay element comprises:
   a. a reference voltage source that is configured to maintain a predetermined reference voltage; and
   b. a first plurality of voltage sensitive signal delay units electrically coupled in series, each of the first plurality of voltage sensitive signal delay units powered by the reference voltage.

4. The delay circuit of claim 3, wherein each of the voltage sensitive signal delay units comprises an inverter.

5. The delay circuit of claim 3, wherein the reference voltage source comprises:
   a. a reference voltage node electrically coupled to the voltage source;
   b. a resistor electrically coupled to the reference voltage node;
   c. a capacitor electrically coupled to the reference voltage node and a common voltage; and
   d. at least one field effect transistor, the at least one field effect transistor including a source that is electrically coupled the reference voltage node, a gate that is electrically coupled to the source and a drain that is electrically coupled to the common voltage.

6. The delay circuit of claim 3, wherein the second delay element comprises a second plurality of voltage sensitive signal delay units electrically coupled in series, each of the second plurality of voltage sensitive signal delay units powered by the voltage source.

7. The delay circuit of claim 6, wherein each of the voltage sensitive signal delay units comprises an inverter.

8. A pulse generator configured to generate an output pulse at a data output, having an output trailing edge, corresponding to an input transition from a data input, comprising:
   a. a delay circuit that generates an inverted copy of the input transition that is temporally offset from the input transition by a minimum amount of time and
   b. an AND gate that ANDs the input transition and the inverted copy of the transition so as to generate the output pulse,
   wherein the delay circuit is powered by a voltage source having a voltage and
   wherein the delay circuit comprises:
      a first delay element that is configured to generate a first data signal with a first edge that has a fixed delay relative to the input transition irrespective of the voltage of the voltage source;
      a second delay element that is configured to generate a second data signal with a second edge that has a timing relationship relative to the input transition that is a function of the voltage of the voltage source; and
      a selection element that causes the output pulse to have a trailing edge corresponding to a latest selected one of the first edge and the second edge, and
   wherein the reference voltage source comprises:
      a reference voltage node electrically coupled to the voltage source;
      a resistor electrically coupled to the reference voltage node;
      a capacitor electrically coupled to the reference voltage node and a common voltage; and
      at least one field effect transistor, the at least one field effect transistor including a source that is electrically coupled the reference voltage node, a gate that is electrically coupled to the source and a drain that is electrically coupled to the common voltage.

9. The pulse generator of claim 8, wherein the first delay element and the second delay element each comprise an inverting delay element that is coupled to the data input and wherein selection element comprises a NAND gate that is coupled to the data output.

10. The pulse generator of claim 8, wherein the first delay element comprises:
    a. a reference voltage source that is configured to maintain a predetermined reference voltage; and
    b. a first plurality of voltage sensitive signal delay units electrically coupled in series, each of the first plurality of voltage sensitive signal delay units powered by the reference voltage.

11. The pulse generator of claim 10, wherein each of the voltage sensitive signal delay units comprises an inverter.

12. The pulse generator of claim 10, wherein the second delay element comprises a second plurality of voltage sensitive signal delay units electrically coupled in series, each of the second plurality of voltage sensitive signal delay units powered by the voltage source.

13. The pulse generator of claim 12, wherein each of the voltage sensitive signal delay units comprises an inverter.

14. A method of generating a data output pulse at a data output based on an input transition at a data input, comprising the actions of:
    a. powering with a predetermined reference voltage a first delay element that generates a first edge that is delayed from the input transition by a minimum delay period;
    b. powering with a variable source voltage a second delay element that generates a second edge that is delayed from the input transition as a function of the variable source voltage; and
    c. generating a data output pulse to the data output so that the data output pulse has an output trailing edge that is selected as the latest of the first edge and the second edge.

15. The method of claim 14, wherein the first delay element and the second delay element each comprise an inverting delay element that is coupled to the data input and wherein selection element comprises a NAND gate that is coupled to the data output.

16. The method of claim 15, wherein the first delay element comprises:
    a. a reference voltage source that is configured to maintain a predetermined reference voltage; and
    b. a first plurality of voltage sensitive inverters electrically coupled in series, each of the first plurality of inverters powered by the reference voltage.

17. The method of claim 15, wherein the second delay element comprises a second plurality of voltage sensitive inverters electrically coupled in series, each of the second plurality of inverters powered by the voltage source.

* * * * *